(12) United States Patent
Ryu et al.

(10) Patent No.: US 9,589,878 B2
(45) Date of Patent: Mar. 7, 2017

(54) SEMICONDUCTOR PACKAGE

(71) Applicant: LG INNOTEK CO., LTD., Seoul (KR)

(72) Inventors: Sung Wuk Ryu, Seoul (KR); Dong Sun Kim, Seoul (KR); Hyun Seok Seo, Seoul (KR); Ji Haeng Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/937,935

(22) Filed: Nov. 11, 2015

(65) Prior Publication Data

US 2016/0133604 A1    May 12, 2016

(30) Foreign Application Priority Data

Nov. 11, 2014  (KR) .................. 10-2014-0156347

(51) Int. Cl.
*H01L 23/498* (2006.01)
*H01L 25/10* (2006.01)
*H01L 25/00* (2006.01)
*H01L 23/00* (2006.01)

(52) U.S. Cl.
CPC .. *H01L 23/49811* (2013.01); *H01L 23/49827* (2013.01); *H01L 25/105* (2013.01); *H01L 25/50* (2013.01); *H01L 23/49822* (2013.01); *H01L 24/16* (2013.01); *H01L 24/32* (2013.01); *H01L 24/48* (2013.01); *H01L 24/73* (2013.01); *H01L 2224/04042* (2013.01); *H01L 2224/16238* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2225/0651* (2013.01); *H01L 2225/06568* (2013.01); *H01L 2225/1023* (2013.01); *H01L 2225/1058* (2013.01); *H01L 2924/00014* (2013.01); *H01L 2924/15311* (2013.01); *H01L 2924/15331* (2013.01); *H01L 2924/37001* (2013.01)

(58) Field of Classification Search
CPC ................ H01L 25/0657; H01L 24/49; H01L 2225/06572; H01L 2924/01028; H01L 2924/014; H01L 2224/48227; H01L 2924/01079; H01L 2225/0651; H01L 2924/01029; H01L 2924/01047; H01L 2924/15738; H01L 2924/15747; H01L 2924/0105; H01L 2924/15701; H01L 2225/0652
USPC ........................................................ 257/692
See application file for complete search history.

(56) References Cited

U.S. PATENT DOCUMENTS

| | | | |
|---|---|---|---|
| 2002/0121692 A1* | 9/2002 | Lee .......................... | H01L 24/05 257/737 |
| 2007/0241463 A1* | 10/2007 | Yamaguchi ......... | H01L 21/4846 257/777 |
| 2008/0284001 A1* | 11/2008 | Mori .................... | H01L 21/4853 257/712 |

(Continued)

*Primary Examiner* — Fernando L Toledo
*Assistant Examiner* — Adam S Bowen
(74) *Attorney, Agent, or Firm* — LRK Patent Law Firm

(57) ABSTRACT

A semiconductor package includes: an upper package to which an element is mounted, and which includes a metal pad portion; a metal post connected to the metal pad portion; and a lower package to which an element is mounted, and which is connected to the metal post.

14 Claims, 7 Drawing Sheets

(56) References Cited

U.S. PATENT DOCUMENTS

| | | | |
|---|---|---|---|
| 2010/0283140 A1* | 11/2010 | Kim | H01L 23/3128 |
| | | | 257/686 |
| 2011/0024899 A1* | 2/2011 | Masumoto | H01L 23/49816 |
| | | | 257/737 |
| 2011/0176280 A1* | 7/2011 | Lee | H01L 23/3677 |
| | | | 361/721 |
| 2012/0013000 A1* | 1/2012 | Haba | H01L 21/565 |
| | | | 257/737 |
| 2012/0145666 A1* | 6/2012 | Maeda | H01L 21/4857 |
| | | | 216/20 |
| 2014/0183731 A1* | 7/2014 | Lin | H01L 23/49816 |
| | | | 257/738 |

* cited by examiner

SEMICONDUCTOR PACKAGE

CROSS-REFERENCE TO RELATED APPLICATION

This application claims priority under 35 U.S.C. §119 to Korean Application No. 10-2014-0156347 filed on Nov. 11, 2014, in the Korean Intellectual Property Office, whose entire disclosure is hereby incorporated by reference.

BACKGROUND OF THE INVENTION

1. Field of the Invention

Embodiments of the present invention relate to semiconductor packages.

2. Description of the Related Arts

According to the development of a semiconductor technique and the users' demand, miniaturization of the size of and lightening of the weight of electronic devices have been implemented. Thus, a multi-chip packaging technique for implementing the same kind or different kinds of semiconductor chips as a single unit package has emerged. The multi-chip packaging method is effective to reduce a package size or weight and to mount semiconductor chips compared to a packaging method for implementing respective semiconductor chips as packages. In particular, the multi-chip packaging is frequently applied to portable communication terminals and the like for which miniaturization and lightening are required.

Among various types of multi-chip packaging, a stack type of multi-chip packaging in which two or more packages are stacked on each other is called Package on Package (hereinafter referred to as "PoP"). According to the development of a semiconductor package technique, and the improvement of high-capacity, thinning and miniaturization of the semiconductor package, the number of laminated chips has been increasing.

In a conventional package on package method, two packages are connected by a solder ball print and reflow process, or a lower package is first molded, and a molded portion is subjected to a laser drilling process so that vias are formed in a PoP pad of the lower package (i.e., a Through Molded Via Method), and a solder ball is printed in the vias, thereby connecting the lower package to an upper package, to which a memory die is mounted, using the reflow process.

In order to implement the high-integration and high performance of package on package products, the number of mounted dies has been increasing, or an attempt to mount a passive element has been performed. For this purpose, it has been required to widen a distance between packages.

However, the semiconductor package according to the conventional art is problematic in that cracks in solder balls or destroy occurs when sizes or heights of the solder balls are increased for widening a distance between semiconductor packages.

SUMMARY OF THE INVENTION

The present invention has been made keeping in mind the above problems, and an aspect of embodiments of the present invention provides a semiconductor package that can realize high density by widening a distance between an upper package and a lower package and increasing the number of mounted chips, and can implement excellent bonding reliability of the upper package and the lower package.

Another aspect of embodiments of the present invention provides a semiconductor package which is configured such that a metal post is fixed to an upper package so that a production process can be simplified and a production time and cost can be reduced.

According to an aspect of embodiments of the present invention, a semiconductor package may include: an upper package to which an element is mounted, and which includes a metal post fixed by a metal pad; and a lower package to which an element is mounted, and which is connected to the metal, post.

The metal post further may include a solder layer made of a metal material on a connection surface between the metal post and the lower package.

The solder layer may be bonded to a circuit pattern of the lower package.

The solder layer may be made of an alloy material of Sn and Cu or an alloy material of Sn and Ag.

The solder layer may be formed on a top surface of the metal post.

The solder layer may be formed to surround the metal post.

The solder layer may be formed on a top surface and a side surface of the metal post.

The metal post may be made of a Cu material.

The upper package may include a core substrate and insulating layers formed on opposite surfaces of the core substrate.

The metal pad portion may be formed on each of the opposite surfaces of the core substrate.

BRIEF DESCRIPTION OF ME DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE INVENTION

Figure 1:
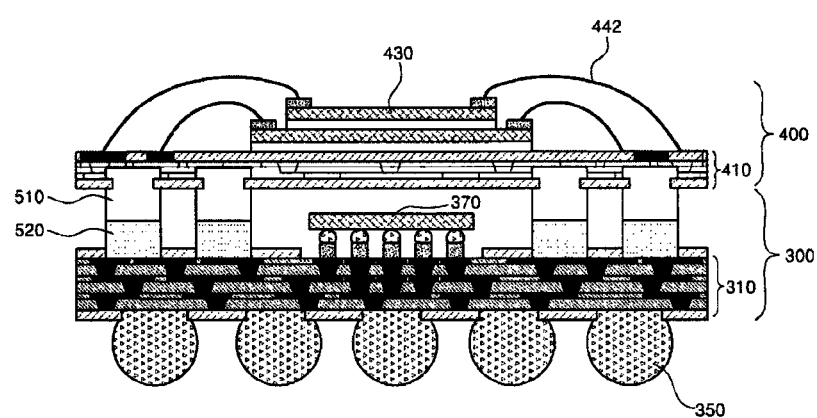
FIG. 1 is a cross sectional view showing a semiconductor package according to an embodiment of the present invention.

Embodiments according to the present invention will now be described more fully hereinafter with reference to the accompanying drawings. This invention may, however, be embodied in different forms and should not be construed as limited to the embodiments set forth herein. In the following description, it is to be noted that, when the functions of conventional elements and the detailed description of elements related with the present invention may make the gist of the present invention unclear, a detailed description of those elements will be omitted. In addition, it should be understood that the shape and size of the elements shown in the drawings may be exaggeratedly drawn to provide an easily understood description of the structure of the present invention, and it should not be interpreted that the shape and size of the elements mean a really applied shape and size.

FIG. 1 is a cross sectional view showing a semiconductor package according to an embodiment of the present invention.

Referring to FIG. 1, the semiconductor package according to the present embodiment of the invention may be configured as a POP (Package On Package) type package in which an upper package 400 is laminated on a lower package 300 so that the upper package and the lower package are electrically connected to each other.

The semiconductor package includes the lower package 300, the upper package 400 and a metal post 510.

The lower package 300 is configured such that at least one lower element 370 is mounted to a lower package substrate 310. Meanwhile, the lower element 370 may be composed of a semiconductor.

The upper package 400 is configured such that at least one upper element 430 is mounted to an upper package substrate 401. Meanwhile, the upper element 430 may be composed of a semiconductor.

At this time, at least one of the lower package substrate 310 and the upper package substrate 410 may be composed of a printed circuit board (PCB).

As one example, the lower package 300 may include the lower package substrate 310, and the lower element 370 mounted to the lower package substrate. When the lower element 370 is formed in plural number, the lower elements may be stacked by interposing an insulating material layer therebetween.

Outer terminals 350 in a solder ball form for electrically connecting the semiconductor package to an external device may be installed on a bottom surface of the lower package substrate 310.

Similarly, the upper package 400 may include the upper package substrate 410, and the upper element 430 mounted to a top surface of the upper package substrate 410. When the upper element 430 is composed in plural number, the upper elements may be stacked by interposing an insulating material layer therebetween.

The upper element 430 and the upper package substrate 410 may be electrically connected to each other via a plurality of bonding wires 442.

The metal post 510 is included in the upper package 400 configured as described above, and is fixed to the upper package substrate 410 via a metal pad. The metal post 510 may contain a Cu material.

At this time, a solder layer 520 is formed on a surface of the metal post 510.

That is, the solder layer 520 is formed on a connection surface between the metal post 510 and the lower package 300 so as to adhere to a circuit pattern of the lower package 300.

According to the embodiment of the present invention, the solder layer 520 may be made of an alloy material of Sn and Cu or an alloy material of Sn and Ag, namely, a high melting point solder material having a melting point of 230° C. to 250° C. The metal post 510 may be made of a Cu material.

When a conventional general solder material is used the general solder material has a melting point of 210° C. to 220° C. However, like in the embodiment of the present invention, when the solder layer 520 is made of a high melting point solder material having the melting point ranging from 230° C. to 250° C., bonding reliability is excellent, and stable process yield can be secured upon laminating the lower package 300.

When the solder layer 520 made of such a high melting point solder material is used, stable process yield can be secured upon performing bonding with the lower package 300, and high-density lamination of semiconductor chips can be realized by increasing a distance between the upper package 400 and the lower package 300, so that a semiconductor package having improved reliability and stability can be formed.

In addition, a surface treatment layer including at least one material of Au and Ni may be further formed on a surface of the metal post 510.

Like in the embodiment of the present invention, when the surface treatment layer is further formed on the surface of the metal post 510, bonding reliability with the lower package 300 can be increased, stable process yield can be secured upon laminating the lower package 300, and at the same time, reliability of the semiconductor package can be secured because the metal post 510 is prevented from being oxidized.

Figure 2:
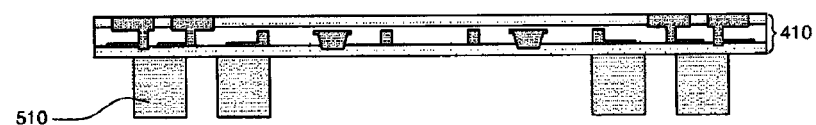
FIGS. 2 and 3 are views illustrated for explaining a metal post of the semiconductor package according to the embodiment of the present invention.
Figure 3:
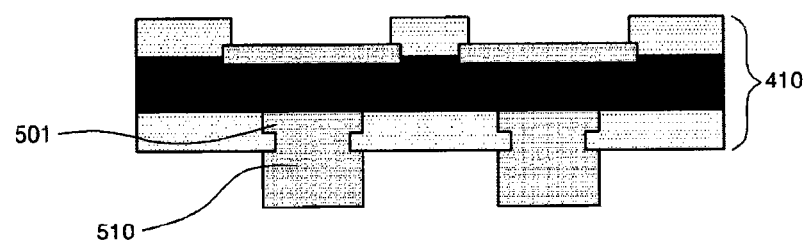
Figure 4:
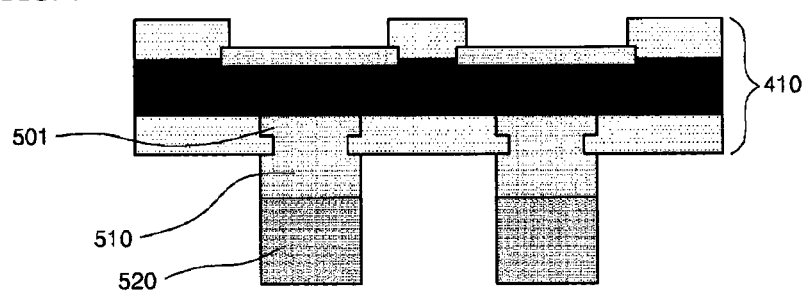
FIGS. 4 and 5 are views illustrated for explaining a metal post of a semiconductor package according to another embodiment of the present invention.
Figure 5:
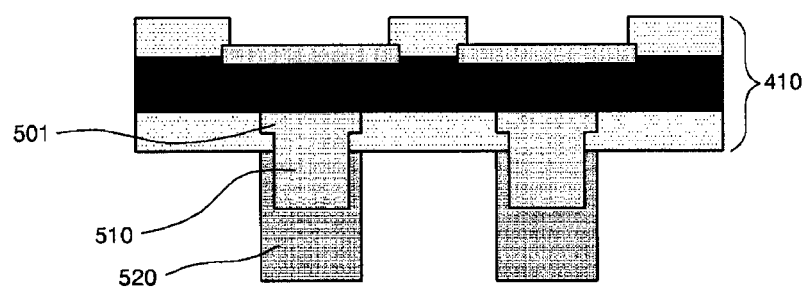

FIGS. 2 and 3 are views illustrated for explaining, a metal post of the semiconductor package according to the embodiment of the present invention, and FIGS. 4 and 5 are views illustrated for explaining a metal post of a semiconductor package according to another embodiment of the present invention.

As illustrated in FIG. 2, the metal post 510 of the semiconductor package according to the embodiment of the present invention is disposed on a bottom surface of the upper package substrate 410.

In detail, as illustrated in FIG. 3, the metal post 510 is formed on a pad portion 501 and is fixed to the upper package substrate 410.

Also, as illustrated in FIGS. 4 and 5, the solder layer 520 may be further formed on the metal post 510.

In detail, as illustrated in FIG. 4, the solder layer 520 may be formed on a top surface of the metal post 510, or as illustrated in FIG. 5, the solder layer 520 may be formed to surround the metal post 510.

At this time, in the embodiment of FIG. 5, the solder layer 520 may be formed to cover both a top surface and a side surface of the metal post 510.

The solder layer 520 configured as described above is bonded to a circuit pattern of the lower package.

In the embodiment illustrated in FIG. 4, the solder layer is formed on the top surface of the metal post 510 using an electroplating method. As such, when the solder layer 520 is formed on the top surface of the metal post 510 using the electroplating method, since there is no need to use a separate solder ball or solder paste in an assembly process, the process can be simplified.

In addition, in the embodiment of FIG. 5, since the solder layer 520 is formed to cover the metal post 510, there is no need to use a separate solder ball or solder paste. Thus, the assembly process can be simplified. Further, since the metal post 510 is disposed in the solder layer 520, the soft property of a solder material constituting the solder layer 520 is compensated so that the solder layer can be formed to have a higher height.

Furthermore, in the embodiment of FIG. 5, since the solder layer 520 is formed to cover both the top surface and the side surface of the metal post 510, surface bonding reliability with the lower package can be increased.

Meanwhile, the metal post 510 may contain a Cu material, and the solder layer 520 may be made of an alloy material of Sn and Cu or an alloy material of Sn and Ag.

FIGS. 6 to 13 are views illustrated for explaining a method of manufacturing a semiconductor package according to an embodiment of the present invention.

Figure 6:
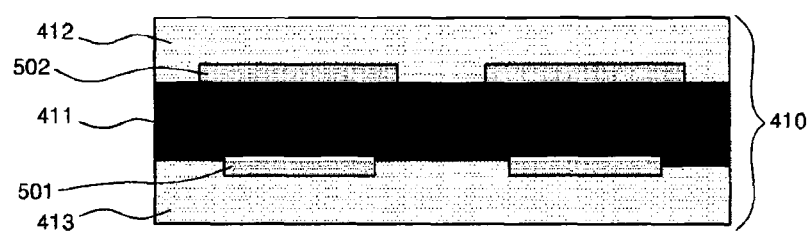
FIGS. 6 to 13 are views illustrated for explaining a method of manufacturing a semiconductor package according to an embodiment of the present invention.

As illustrated in FIG. 6, insulating layers 412, 413 are formed on a core substrate 411 on which the pad portions 501, 502 are formed.

Figure 7:
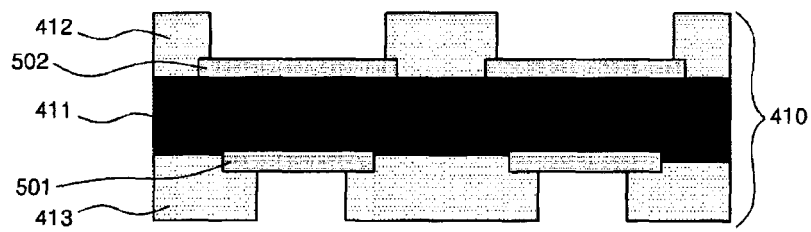

Then, as illustrated in FIG. 7, openings to which the pad portions 501, 502 are exposed are formed in, the insulating layers 412, 413.

Figure 8:
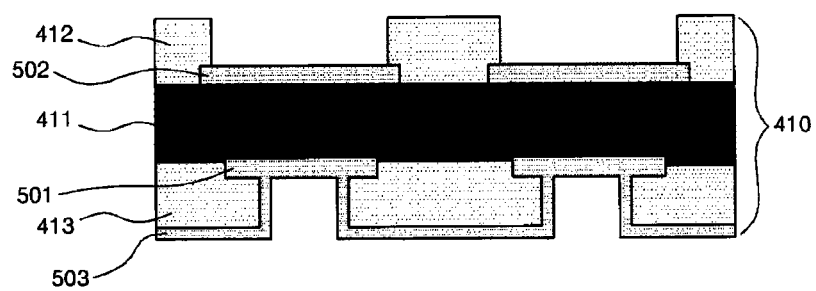

Then, as illustrated in FIG. 8, a metal seed layer 503 intended for forming the metal post is formed on the insulating layer 413 arranged at the pad portions 501, 502.

Figure 9:
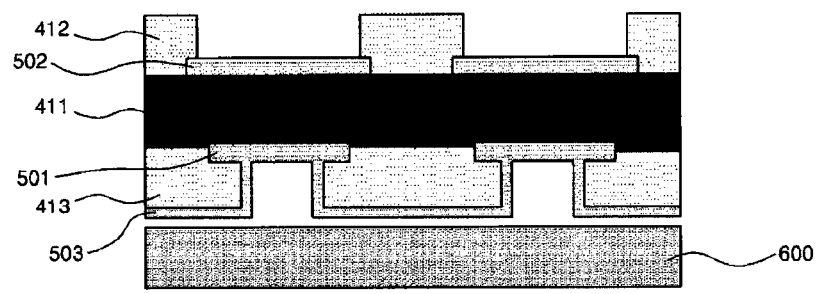
Figure 10:
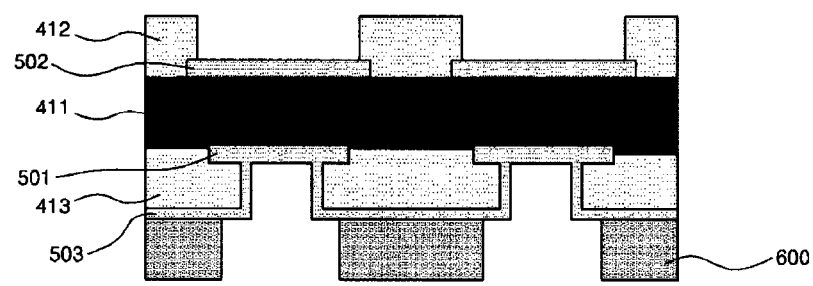

Then, as illustrated in FIG. 9, a photoresist layer 600 is formed thereon, and as illustrated in FIG. 10, an opening is formed in the photoresist layer 600.

Figure 11:
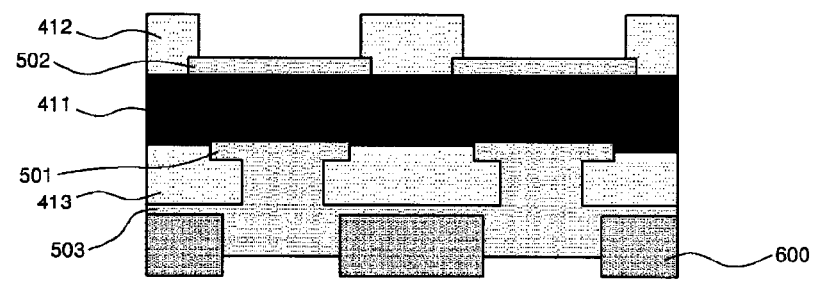

Then, as illustrated in FIG. 11, the openings formed in the insulating layer 413 and the photoresist layer 600 are filled with a metal material. At this time, a surface treatment layer may be further formed on a surface of the openings filled with the metal material.

Figure 12:
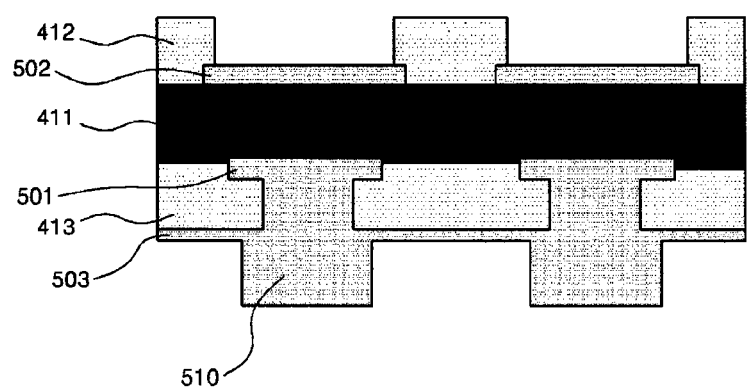
Figure 13:
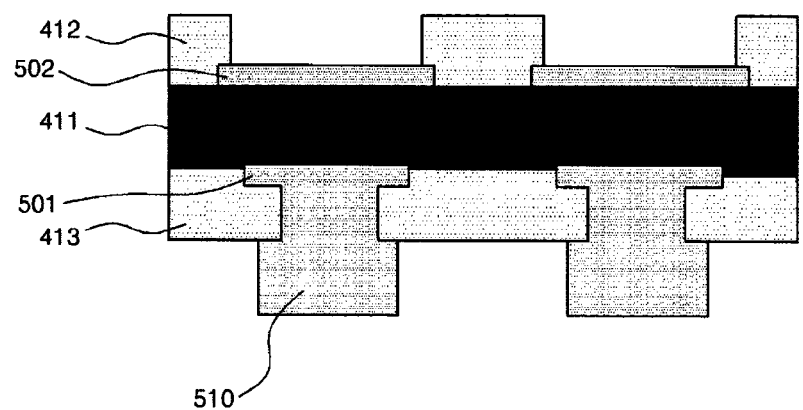

Then, as illustrated in FIG. 12, the photoresist layer 600 is removed, and as illustrated in FIG. 13, the metal seed layer 503 is removed, thereby completing the metal post 510.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and, their equivalents.

What is claimed is:

1. A semiconductor package comprising:
an upper package to which an element is mounted, and which includes a metal post fixed by a metal pad portion, a surface treatment layer on a surface of the metal post, and a solder layer on a surface of the surface treatment layer; and
a lower package to which an element is mounted, and which is connected to the metal post,
wherein the metal post is protruded downward from a bottom surface of the upper package.

2. The semiconductor package of claim 1, wherein the solder layer is disposed on a connection surface between the metal post and the lower package.

3. The semiconductor package of claim 2, wherein the solder layer is bonded to a circuit pattern of the lower package.

4. The semiconductor package of claim 2, wherein the solder layer is made of an alloy material of Sn and Cu or an alloy material of Sn and Ag.

5. The semiconductor package of claim 2, wherein the solder layer surrounds the metal post.

6. The semiconductor package of claim 2, wherein the solder layer is formed on the bottom surface and a side surface of the metal post.

7. The semiconductor package of claim 1, wherein the metal post is made of a Cu material.

8. The semiconductor package of claim 1, wherein the upper package comprises:
an upper package substrate; and
an upper element on the upper package substrate.

9. The semiconductor package of claim 8, further comprising bonding wires connecting the upper element to the upper package substrate.

10. The semiconductor package of claim 8, wherein the metal pad portion is formed on each of opposite surfaces of the upper package substrate.

11. The semiconductor package of claim 1, wherein the upper package substrate or the lower package substrate is a printed circuit board.

12. The semiconductor package of claim 1, wherein the lower package comprises:
a lower package substrate; and
a lower element on the lower package substrate.

13. The semiconductor package of claim 12, further comprising outer terminals formed on a bottom surface of the lower package substrate and electrically connecting the semiconductor package to an external device.

14. The semiconductor package of claim 1, wherein the surface treatment layer contains Au or Ni.

* * * * *